US009240532B2

(12) United States Patent
Lai

(10) Patent No.: US 9,240,532 B2
(45) Date of Patent: Jan. 19, 2016

(54) LED PACKAGE STRUCTURE

(71) Applicant: SO BRIGHT ELECTRONICS CO., LTD., Hsinchu (TW)

(72) Inventor: Han-Chung Lai, Taoyuan County (TW)

(73) Assignee: SO BRIGHT ELECTRONICS CO., LTD., Hsinchu (TW)

( * ) Notice: Subject to any disclaimer, the term of this patent is extended or adjusted under 35 U.S.C. 154(b) by 582 days.

(21) Appl. No.: 13/650,353

(22) Filed: Oct. 12, 2012

(65) Prior Publication Data
US 2013/0033866 A1 Feb. 7, 2013

Related U.S. Application Data

(63) Continuation-in-part of application No. 12/032,134, filed on Feb. 15, 2008, now abandoned.

(51) Int. Cl.
*B60Q 1/26* (2006.01)
*H01L 33/54* (2010.01)
*H01L 33/62* (2010.01)

(52) U.S. Cl.
CPC ............... *H01L 33/54* (2013.01); *H01L 33/62* (2013.01); *H01L 2224/48091* (2013.01); *H01L 2224/48247* (2013.01); *H01L 2924/3025* (2013.01)

(58) Field of Classification Search
CPC ...... H01L 33/54; F21S 48/12; F21S 48/1154; F21V 5/008; F21V 5/048
See application file for complete search history.

(56) References Cited

U.S. PATENT DOCUMENTS

| | | | |
|---|---|---|---|
| 2003/0169160 A1* | 9/2003 | Rodriguez Barros et al. | 340/426.1 |
| 2011/0211337 A1* | 9/2011 | Ito et al. | 362/97.1 |
| 2012/0305949 A1* | 12/2012 | Donofrio et al. | 257/88 |

* cited by examiner

*Primary Examiner* — Ali Alavi
(74) *Attorney, Agent, or Firm* — Li & Cai Intellectual Property (USA) Office

(57) ABSTRACT

A LED package structure includes a substrate unit, a light-emitting unit and a package unit. The substrate unit includes two lead frames, and light-emitting unit including a LED chip electrically connected between the two lead frames. The package unit includes a light-transmitting package body enclosing the light-emitting unit and one part of each lead frame and a lens body integrated with the light-transmitting package body, and another part of each lead frame is exposed from the light-transmitting package body. Therefore, light beams generated by the LED chip pass through the lens body to project a cross light pattern on a plane, the cross light pattern has a concentrated cross light shape and a scattered light shape surrounding the concentrated cross light shape, the luminous intensity of the concentrated cross light shape is substantially the same and larger than the luminous intensity of the scattered light shape.

12 Claims, 18 Drawing Sheets

| V | II | Spec |
|---|---|---|
| -10 | -5 | 20 |
| -10 | 5 | 20 |
| -5 | -20 | 10 |
| -5 | -10 | 20 |
| -5 | 0 | 70 |
| -5 | 10 | 20 |
| -5 | 20 | 10 |
| 0 | -10 | 35 |
| 0 | -5 | 90 |
| 0 | 0 | 100 |
| 0 | 5 | 90 |
| 0 | 10 | 35 |
| 5 | -20 | 10 |
| 5 | -10 | 20 |
| 5 | 0 | 70 |
| 5 | 10 | 20 |
| 5 | 20 | 10 |
| 10 | -5 | 20 |
| 10 | 5 | 20 |

| V | H | Spec(%) |
|---|---|---|
| -10 | -5 | 20 |
| -10 | 5 | 20 |
| -5 | -20 | 12.5 |
| -5 | -10 | 37.5 |
| -5 | 0 | 87.5 |
| -5 | 10 | 37.5 |
| -5 | 20 | 12.5 |
| 0 | -10 | 50 |
| 0 | -5 | 100 |
| 0 | 0 | 100 |
| 0 | 5 | 100 |
| 0 | 10 | 50 |
| 5 | -20 | 12.5 |
| 5 | -10 | 37.5 |
| 5 | 0 | 87.5 |
| 5 | 10 | 37.5 |
| 5 | 20 | 12.5 |
| 10 | -5 | 20 |
| 10 | 5 | 20 |

LED PACKAGE STRUCTURE

CROSS REFERENCE TO RELATED APPLICATION

This application is a Continuation-In-Part of pending U.S. patent application Ser. No. 12/032,134, filed on Feb. 15, 2008, and entitled "LIGHT EMITTING DIODE FOR AUTOMOTIVE LAMP", which claims priority of Taiwan Patent Application No. 096202973, filed on Feb. 15, 2007, the entirety of which is incorporated by reference herein.

BACKGROUND OF THE INVENTION

1. Field of the Invention

The instant disclosure relates to a LED package structure, and more particularly to a LED package structure for projecting a cross light pattern on a plane without using any shield for regulating the light form.

2. Description of Related Art

Traditionally, lamps for automobiles use bulbs as light sources, and have a painted cover added additionally according to different uses of the automotive lamps. However, such application wastes energy, and due to the short working life of the bulbs, if the bulbs are damaged suddenly during running, human life will be threatened. In order to eliminate such situation, alternative light sources for replacing the bulbs are available on the market.

Currently, the most commonly used alternative light sources are light emitting diodes (LEDs). LED is a light emitting component of semiconductor process and has the advantages of good vibration resistance, being power saving, long working life, without idling time, rapid response speed, having diverse and pure colors, and thus the disadvantages of conventional bulbs, such as power wasting and short working life, can be effectively alleviated. Further, if the LED has a circuit design control, it can exert the functions after being damaged, thus avoiding the traffic accidents due to disabled light source.

SUMMARY OF THE INVENTION

One aspect of the instant disclosure relates to a LED package structure for projecting a cross light pattern on a plane without using any shield for regulating the light form.

One of the embodiments of the instant disclosure provides a LED package structure, comprising: a substrate unit, a light-emitting unit and a package unit. The substrate unit includes at least two lead frames separated from each other, wherein each lead frame has an embedded portion and an exposed portion connected with the embedded portion. The light-emitting unit including at least one LED chip disposed on one of the at least two lead frames and electrically connected between the at least two lead frames. The package unit includes a light-transmitting package body enclosing the light-emitting unit and the embedded portion of each lead frame and a lens body integrated with the light-transmitting package body and disposed above the at least one LED chip, wherein the exposed portion of each lead frame is exposed from the light-transmitting package body.

More precisely, the lens body has two first light output surfaces symmetrical to each other, two second light output surfaces symmetrical to each other, and a third light output surface disposed on the topmost side thereof to connected to the two first light output surfaces and the two second light output surfaces, and the two first light output surfaces and the two second light output surfaces are alternately connected to each other to form a first surrounding light output surface. In addition, light beams generated by the at least one LED chip pass through the lens body of the package unit to project a cross light pattern on a plane, the cross light pattern has a concentrated cross light shape and a scattered light shape surrounding the concentrated cross light shape, the luminous intensity of the concentrated cross light shape is substantially the same and larger than the luminous intensity of the scattered light shape.

To further understand the techniques, means and effects of the instant disclosure applied for achieving the prescribed objectives, the following detailed descriptions and appended drawings are hereby referred, such that, through which, the purposes, features and aspects of the instant disclosure can be thoroughly and concretely appreciated. However, the appended drawings are provided solely for reference and illustration, without any intention to limit the instant disclosure.

BRIEF DESCRIPTION OF THE DRAWINGS

The patent or application file contains at least one drawing executed in color. Copies of this patent or patent application publication with color drawings will be provided by the Office upon request and payment of necessary fee.

FIG. 3a is a luminous intensity distribution meeting the requirements of ECE regulations;

FIG. 3b is a light form distribution view of the luminous intensity of FIG. 3a;

DETAILED DESCRIPTION OF THE PREFERRED EMBODIMENTS

Figure 1:
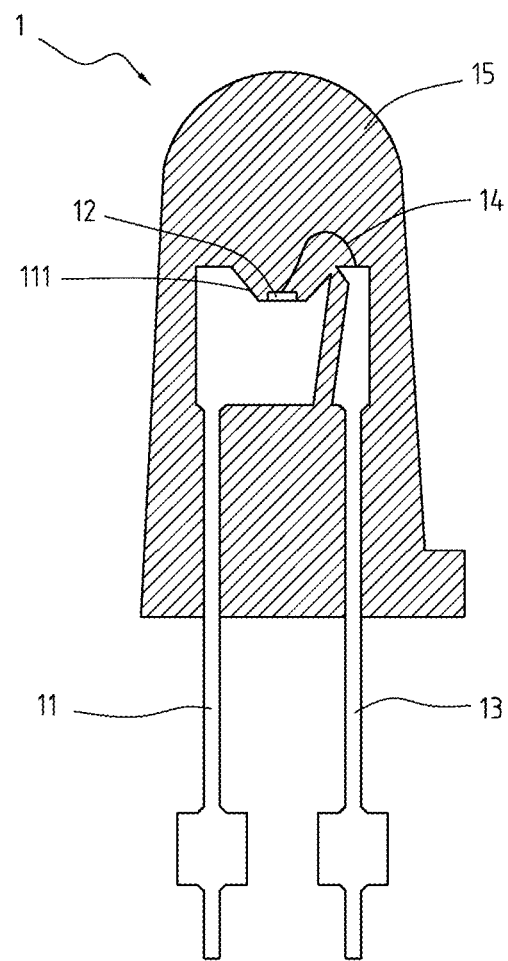
FIG. 1 is a cross sectional view of the LED.
Figure 2:
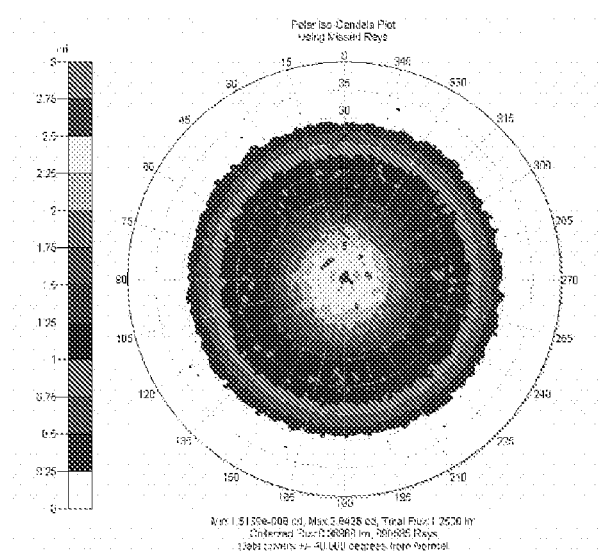
FIG. 2 is light form distribution view of the LED.

The foregoing aspects, as well as many of the attendant advantages and features of this invention will become more apparent by reference to the following detailed description, when taken in conjunction with the accompanying drawings, wherein:

FIG. 1 is a cross sectional view of a light emitting diode (LED). As shown in FIG. 1, a LED 1 includes a support 11 having a reflection accommodation area 111, a chip 12 planted in the reflection accommodation area 111, another support 13 connected to the chip 12 through a gold thread 14, and a molding compound 15 with an end of a hemispherical column and covering the chip 12. Referring to FIG. 2, it is a light form view of the LED. As the LED 1 has a symmetrical optical structure, when the LED 1 emits light, the light form distribution of the light is as shown in FIG. 2 and assumes a symmetrical circular light form distribution.

Figures 3A, 3B:
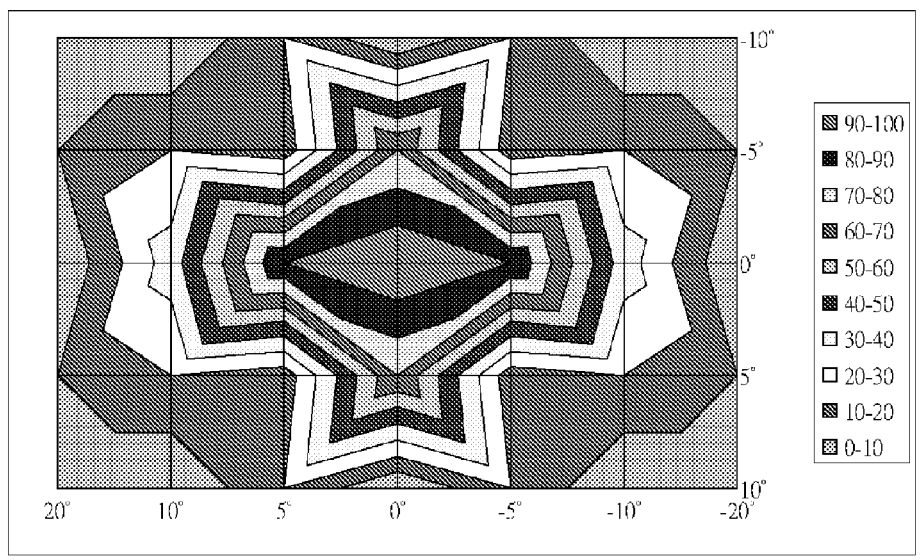
Figures 3C, 3D:
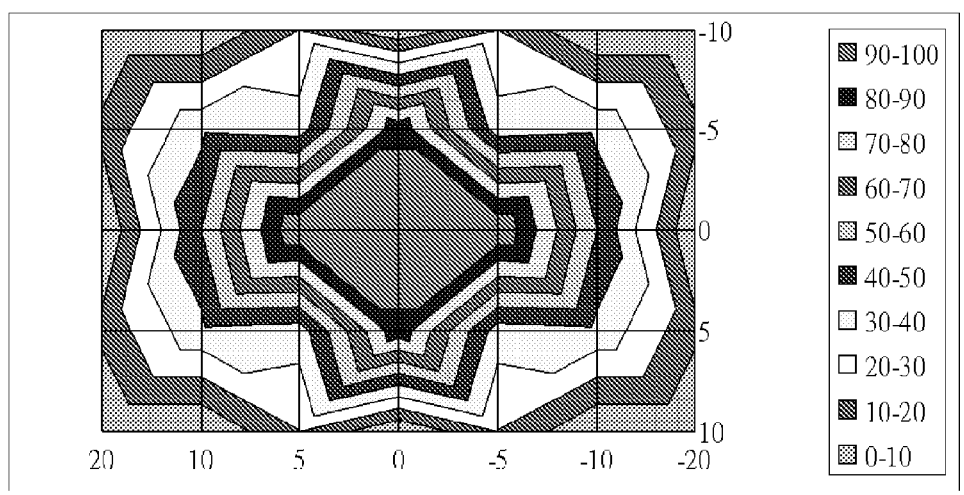
FIG. 3c is a luminous intensity distribution meeting the requirements of SAE regulations.
FIG. 3d is a light form distribution view of the luminous intensity of FIG. 3c.

Next, referring to FIGS. 3a and 3b, FIG. 3a is a luminous intensity distribution regulated by ECE regulations, in which merely the luminous intensity regulated for the brake lights and indicators are illustrated, and FIG. 3b is a light form distribution view regulated by ECE regulations drawing with the luminous intensity of FIG. 3a corresponding to the angles of a longitudinal axis and a horizontal axis. Referring to FIGS. 3c and 3d, FIG. 3c is a luminous intensity regulated by SAE regulation, in which merely the luminous intensity regulated for the brake lights and indicators are illustrated, and FIG. 3d is a light form distribution view regulated by SAE regulations according to the luminous intensity of FIG. 3c corresponding to the angles of a longitudinal axis and a horizontal axis. It can be found by comparing the light form distribution views in FIGS. 3b and 3d that, the light form distributions defined by ECE and SAE all assume a symmetrical and cross-axis light form distribution. It can be found by further comparing with FIG. 2 that, the light form distribution of the LED is different from those defined by ECE and SAE. When the LED 1 is applied to an automotive lamp, in order to meet the requirements for the symmetrical and cross-axis light form distribution regulated by ECE or SAE, an additional shield is required or the number of the LEDs 1 is increased, which not only increases the cost, but also wastes the light energy and increases the power consumption.

Accordingly, the instant disclosure provides an LED. The light form of the light emitted from the LED meets the requirements for the light form distribution regulated by ECE and SAE. The LED has a cross-axis symmetrical optical structure disposed on a light emitting path. Two ends of an axis of the optical structure are in the same shape, such that the light form distribution of the light can be in a symmetrical cross-axis distribution due to the optical structure.

Figure 4:
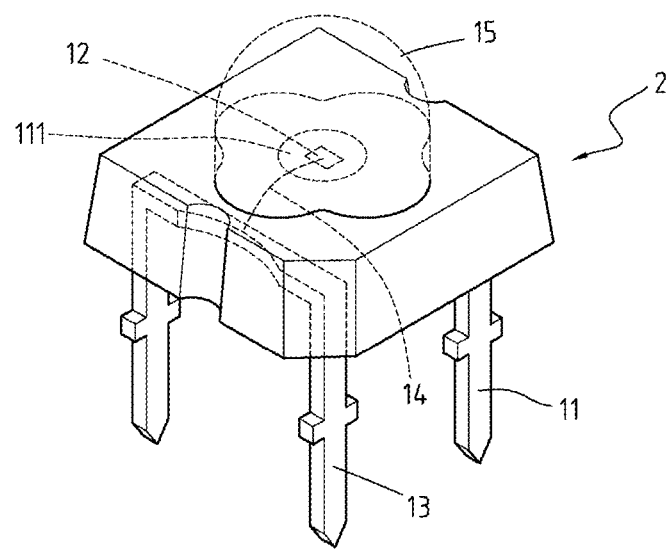
FIG. 4 is a three-dimensional view of a first embodiment of the instant disclosure.
Figure 5:
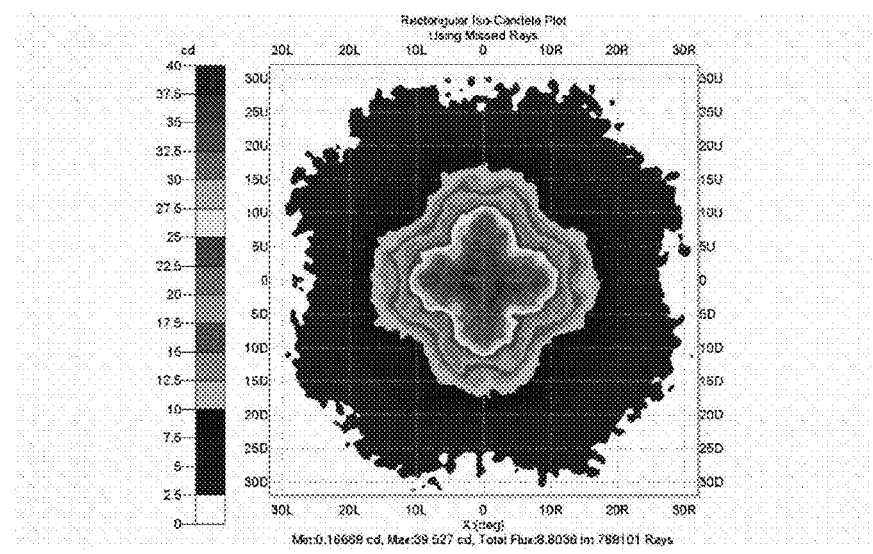
FIG. 5 is a light form distribution view of the first embodiment of the instant disclosure.

FIG. 4 is a three-dimensional view of a first embodiment of the instant disclosure. As shown in FIG. 4, an LED 2 of this embodiment includes a support 11 having a reflection accommodation area 111, a chip 12 planted in the reflection accommodation area 111, and another support 13 connected to the chip 12 through a gold thread 14. The molding compound 15 has a cross-axis symmetrical optical structure. If the LED 2 is used to perform optical simulation, the simulation results shown in FIG. 5 can be obtained. FIG. 5 is a light form distribution view of the first embodiment. It can be known from FIG. 5 that the light form of the light emitted from the LED 2 assumes a symmetrical cross-axis light form distribution.

Figure 6:
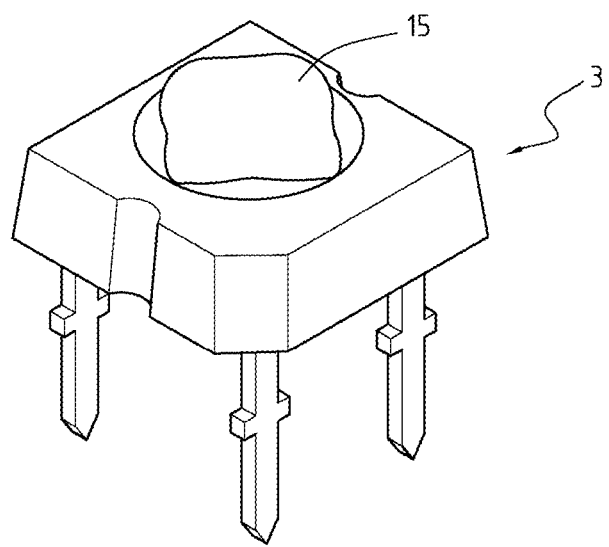
FIG. 6 is a three-dimensional view of a second embodiment of the instant disclosure.

FIG. 6 is a three-dimensional view of a second embodiment of the instant disclosure. The difference between this embodiment and the first embodiment lies in the optical structure of the molding compound 15. In the first embodiment, the molding compound 15 of the LED 3 is a cross-axis symmetrical optical structure (referring to FIG. 4). In the LED of this embodiment, the molding compound 15 further has a cross-axis symmetrical optical structure thereon, and the light emitted from the LED 3 also assumes a symmetrical cross-axis light form distribution due to the optical structure.

Figure 7:
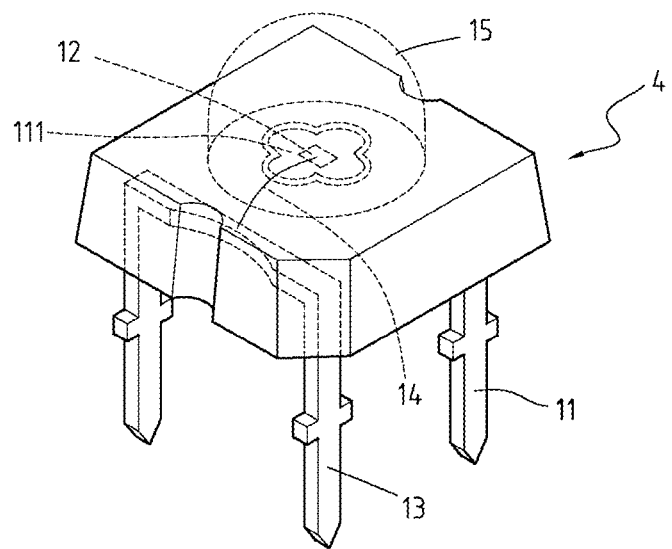
FIG. 7 is a three-dimensional view of a third embodiment of the instant disclosure.

Further, according to the instant disclosure, the same light form distribution can be obtained by an LED 4 shown in FIG. 7. FIG. 7 is a three-dimensional view of a third embodiment of the instant disclosure. The LED 4 of this embodiment is characterized in that the reflection accommodation area 111 is a cross-axis symmetrical optical structure. When the LED 4 emits light, the light is reflected by the reflection accommodation area 111, such that the light form of the light assumes a symmetrical cross-axis light form distribution.

Figure 8A:
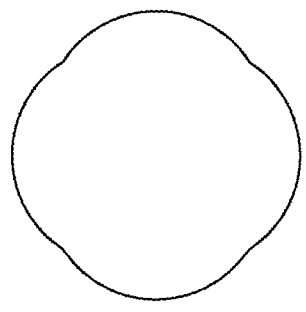
FIG. 8a is a top view of an optical structure according to the first embodiment of the instant disclosure.
Figure 8B:
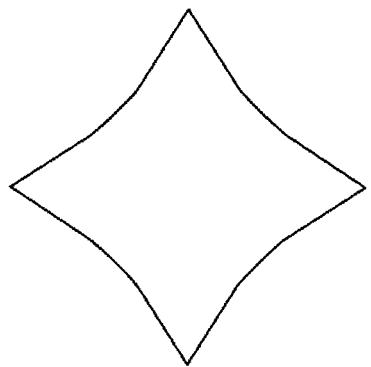
FIG. 8b is a top view of an optical structure according to a forth embodiment of the instant disclosure.
Figure 8C:
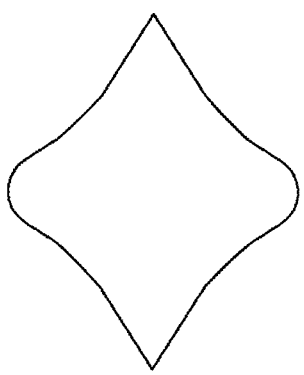
FIG. 8c is a top view of an optical structure according to a fifth embodiment of the instant disclosure.
Figure 8D:
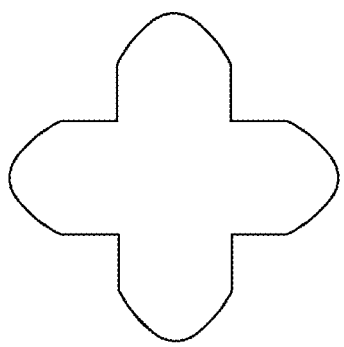
FIG. 8d is a top view of an optical structure according to a sixth embodiment of the instant disclosure.

In the LED, the optical structure is a cross-axis symmetrical structure, and two ends of an axis must be in the same shape, such as an arc shape, a triangular shape, or a square shape, and the shape of the optical structure can make reference to FIGS. 8a, 8b, 8c, and 8d. FIG. 8a is an optical structural view of the first embodiment of the instant disclosure, FIG. 8b is an optical structural view of a fourth embodiment of the instant disclosure, FIG. 8c is an optical structural view of a fifth embodiment of the instant disclosure, and FIG. 8d is an optical structural view of a sixth embodiment of the instant disclosure.

Figure 9:
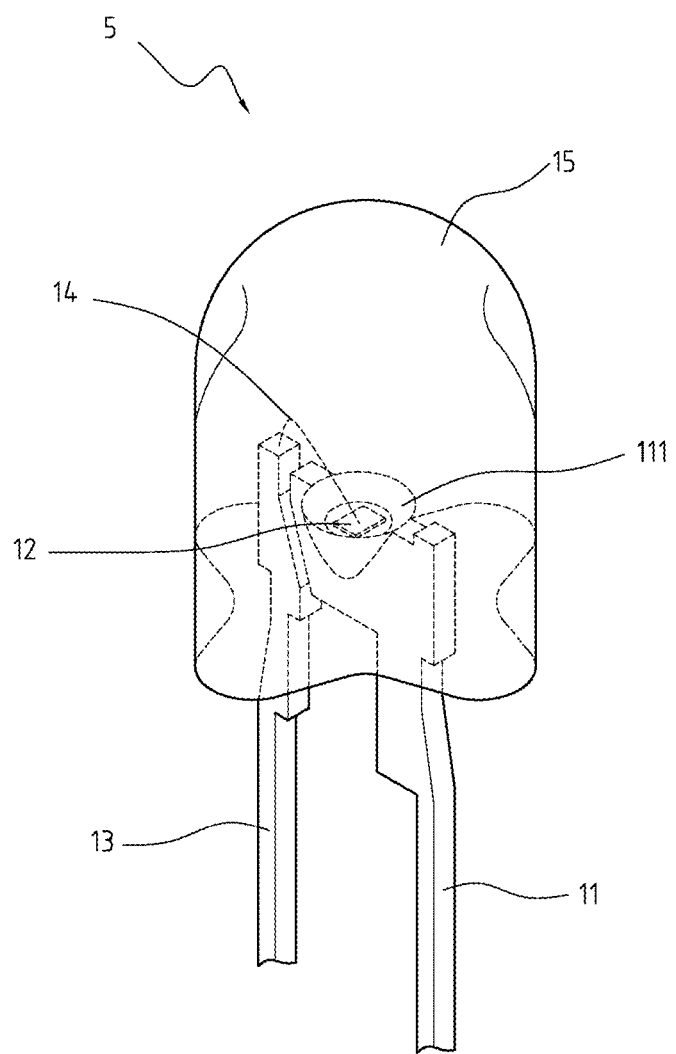
FIG. 9 is a three-dimensional view of the instant disclosure applied to a Through-Hole LED.
Figure 10:
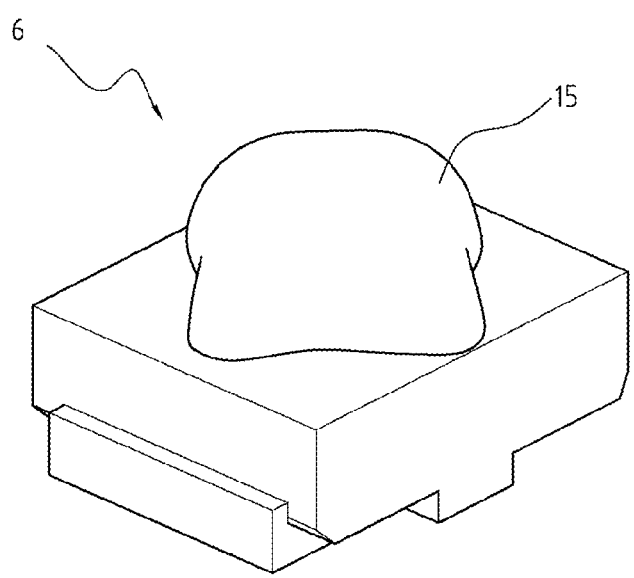
FIG. 10 is a three-dimensional view of the instant disclosure applied to a Top LED.
Figure 11:
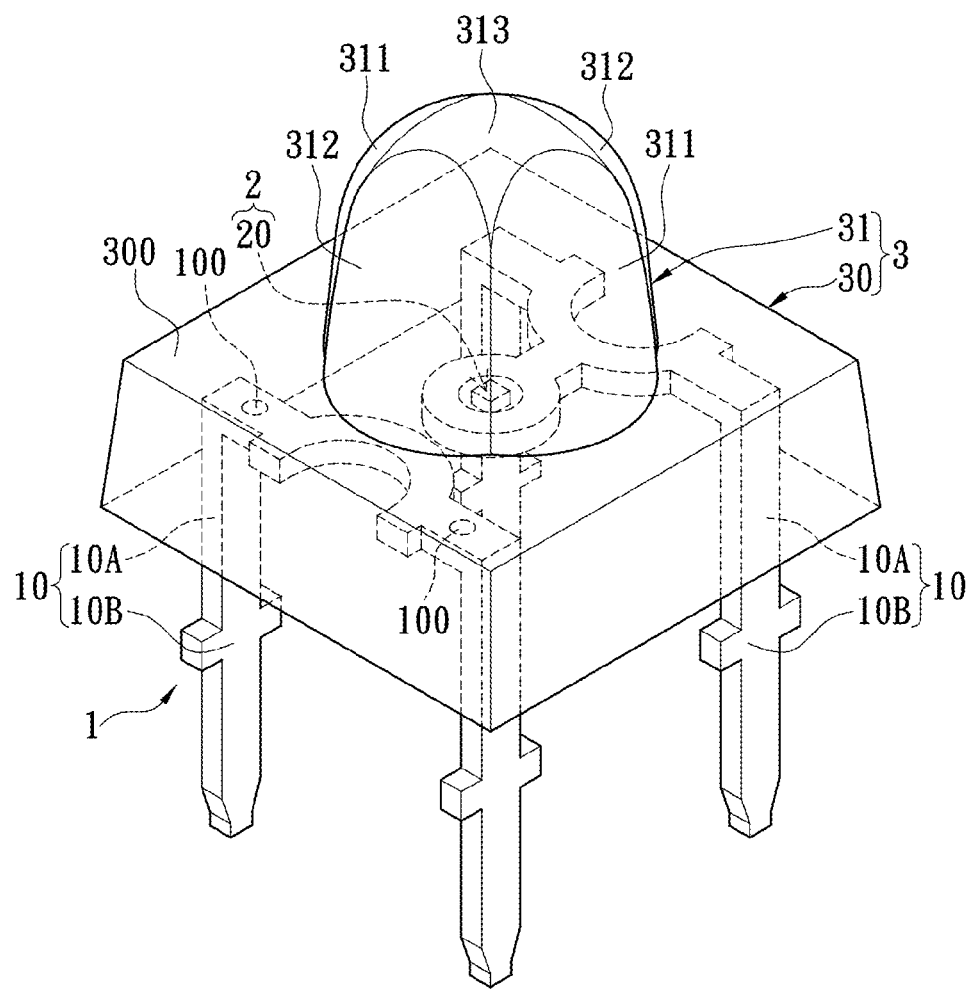
FIG. 11 is a perspective, schematic view of the LED package structure according to the instant disclosure.

Further, the instant disclosure is not merely as shown in FIGS. 4, 6, and 7, and the optical structure of the instant disclosure is applicable in an Superflux LED, or as shown in FIGS. 9 and 10, applicable in a Through-Hole LED and a Top LED. FIG. 9 is a three-dimensional view of the instant disclosure applied to a Through-Hole LED. A molding compound 15 of a LED 5 is a cross-axis symmetrical optical structure. When the LED 5 emits light, the light passes through the molding compound 15, such that the light form of the light assumes a cross-axis distribution. FIG. 10 is a three-dimensional view of the instant disclosure applied to a Top LED. A molding compound 15 of a LED 6 is also a cross-axis symmetrical optical structure. As described above, when the LED 6 emits light, the light passes through the molding compound 15, such that the light form of the light assumes a cross-axis distribution.

Referring to FIGS. 11 to 17, where the instant disclosure provides a LED package structure Z comprising: a substrate unit 1, a light-emitting unit 2 and a package unit 3. The substrate unit 1 includes at least two lead frames 10 separated from each other, and each lead frame 10 has an embedded portion 10A and an exposed portion 10B connected with the embedded portion 10A. The light-emitting unit 2 includes at least one LED chip 20 or a plurality of LED chips disposed on one of the two lead frames 10 and electrically connected between the two lead frames 10. The package unit 3 includes a light-transmitting package body 30 enclosing the light-emitting unit 2 and the embedded portion 10A of each lead frame 10 and a lens body 31 integrated with the light-transmitting package body 30 and disposed above the LED chip 20, the lens body 31 has a topmost point 3100 disposed directly above the LED chip 20, and the exposed portion 10B of each lead frame 10 is exposed from the light-transmitting package body 30. For example, one of the two lead frames 10 has a plurality through holes 100 passing through the corresponding embedded portion 10A and filled with the light-transmitting package body 30.

Figure 15:
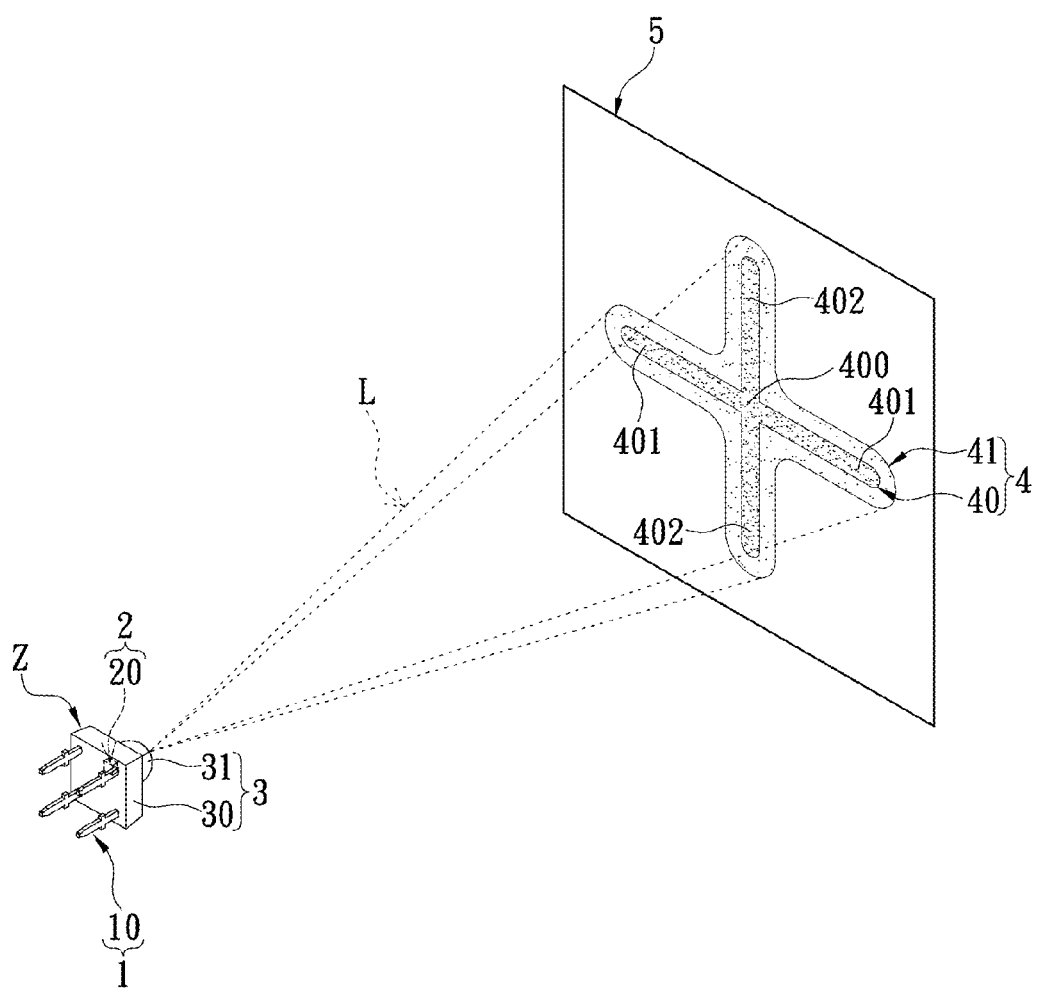
FIG. 15 is a perspective, schematic view of light beams generated by the LED chip passing through the lens body to project a cross light pattern on a plane according to the instant disclosure.
Figure 16:
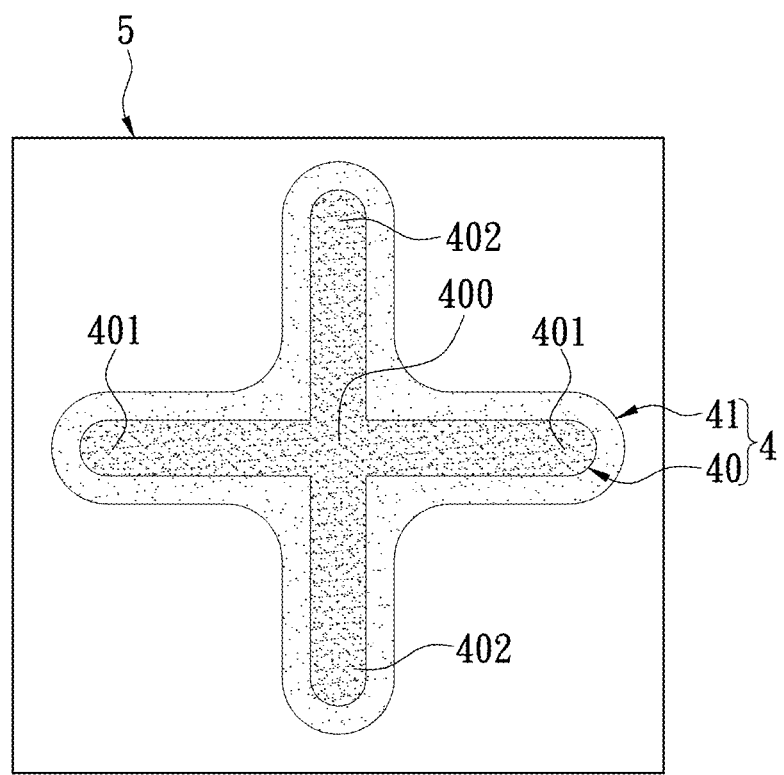
FIG. 16 is a schematic view of the cross light pattern on the plane according to the instant disclosure.
Figure 17:
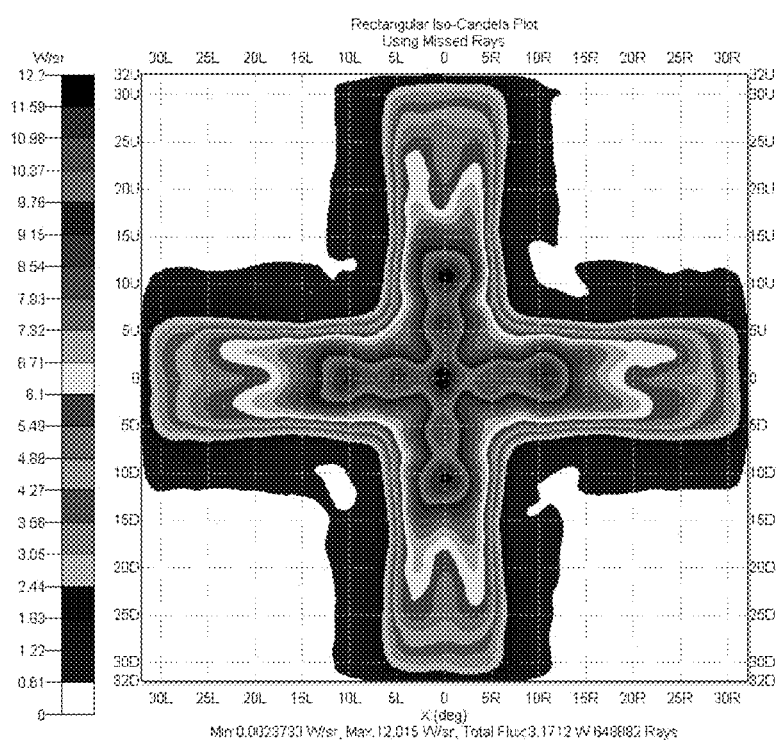
FIG. 17 is a simulation diagram of the light form distribution of the cross light pattern generated by the LED package structure according to the instant disclosure.

More precisely, the lens body 31 has two first light output surfaces 311 symmetrical to each other, two second light output surfaces 312 symmetrical to each other, and a third light output surface 313 disposed on the topmost side thereof to connected to the two first light output surfaces 311 and the two second light output surfaces 312, and the two first light output surfaces 311 and the two second light output surfaces 312 are alternately connected to each other to form a first surrounding light output surface. In addition, the lens body 31 has two first inclined surfaces 314 symmetrical to each other and respectively extended from the two first light output surfaces 311 to the top surface 300 of the light-transmitting package body 30 and two second inclined surfaces 315 symmetrical to each other and respectively extended from the two second light output surfaces 312 to the top surface 300 of the light-transmitting package body 30, and the two first inclined surfaces 314 and the two second inclined surfaces 315 are alternately connected to each other to form a second surrounding light output surface connected between the first surrounding light output surface and the top surface 300 of the light-transmitting package body 30. Moreover, light beams L generated by the LED chip 20 pass through the lens body 31 of the package unit 3 to project a cross light pattern 4 on a plane 5, the cross light pattern 4 has a concentrated cross light shape 40 and a scattered light shape 41 surrounding the concentrated cross light shape 40, the luminous intensity of the concentrated cross light shape 40 is substantially the same and larger than the luminous intensity of the scattered light shape 41 as shown in FIGS. 15-17, where FIG. 17 shows a simulation diagram of the light form distribution of the cross light pattern 4 generated by the LED package structure Z according to the instant disclosure, and the simulation light form distribution is very similar to the cross light pattern 4 generated by generated by the LED package structure Z.

More precisely, each first light output surface 311 is a first elliptical surface defined by a first major axis 311a and a first minor axis 311b, each second light output surface 312 is a second elliptical surface defined by a second major axis 312a and a second minor axis 312b, and the third light output surface 313 is an arc surface defined by an arc center C and a radius R, where the topmost point of the third light output surface 313 (i.e., the arc surface) is the topmost point 3100 of the lens body 31. The first major axis 311a and the second major axis 312a are overlapped, the lengths of the first major axis 311a and the second major axis 312a are the same, the first minor axis 311b and the second minor axis 312b are vertical with each other, the lengths of the first minor axis 311b and the second minor axis 312b are the same, and the arc center C of the arc surface is disposed on the first major axis 311a and the second major axis 312a.

More precisely, the concentrated cross light shape 40 has a center portion 400 corresponding to the third light output surface 313, two horizontal extending portions 401 respectively and horizontally extended from the left side and the right side of the center portion 400 and corresponding to the first light output surfaces 311, and two vertical extending portions 402 respectively and vertically extended from the top side and the bottom side of the center portion 400 and corresponding to the second light output surfaces 312. In addition, the light beams L generated by the LED chip 20 pass through the third light output surface 313 of the lens body 30 to project the center portion 400 of the concentrated cross light shape 40 on the plane 5, the light beams L generated by the LED chip 20 pass through the two first light output surfaces 311 of the lens body 31 to respectively project the two horizontal extending portions 401 of the concentrated cross light shape 40 on the plane 5, and the light beams L generated by the LED chip 20 pass through the two second light output surfaces 312 of the lens body 31 to respectively project the two vertical extending portions 402 of the concentrated cross light shape 40 on the plane 5. Furthermore, when the luminous intensity of the light beams L passing through the third light output surface 313 (i.e., the arc surface) is halved by scattering, a half of the luminous intensity of the center portion 400 is equal to the luminous intensity of each horizontal extending portion 401 and the luminous intensity of each vertical extending portion 402, thus the luminous intensity of the concentrated cross light shape 40 is substantially the same due to the design of the arc light output surface 313.

Figure 12:
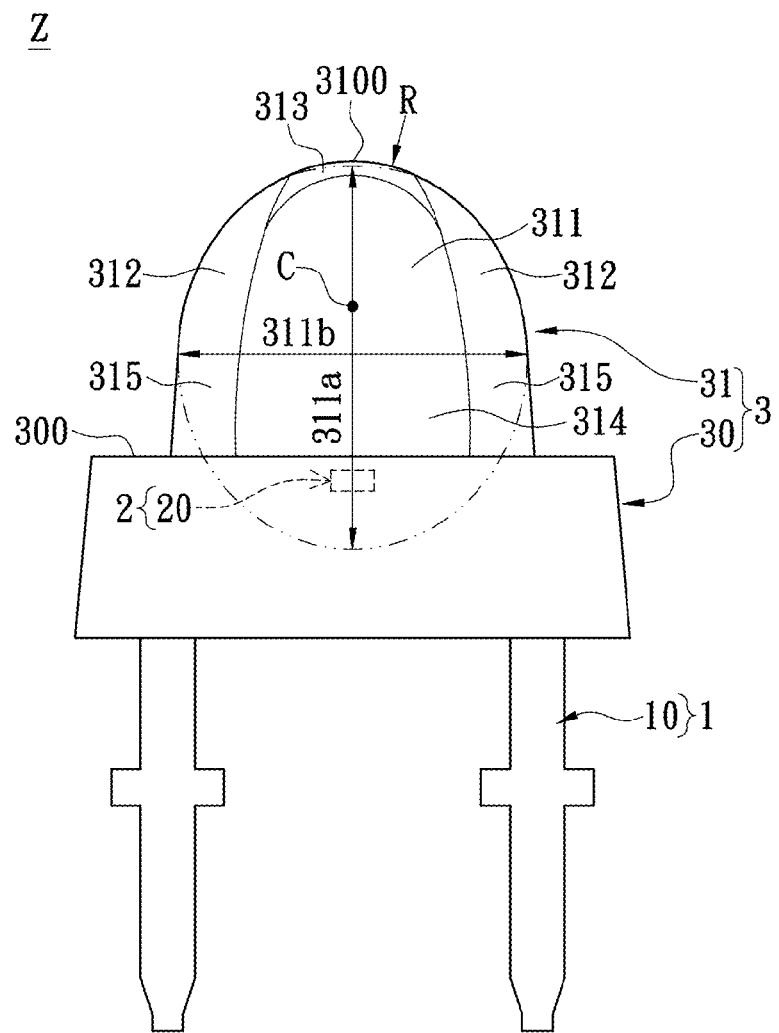
FIG. 12 is a front (or back), schematic view of the LED package structure according to the instant disclosure.
Figure 13:
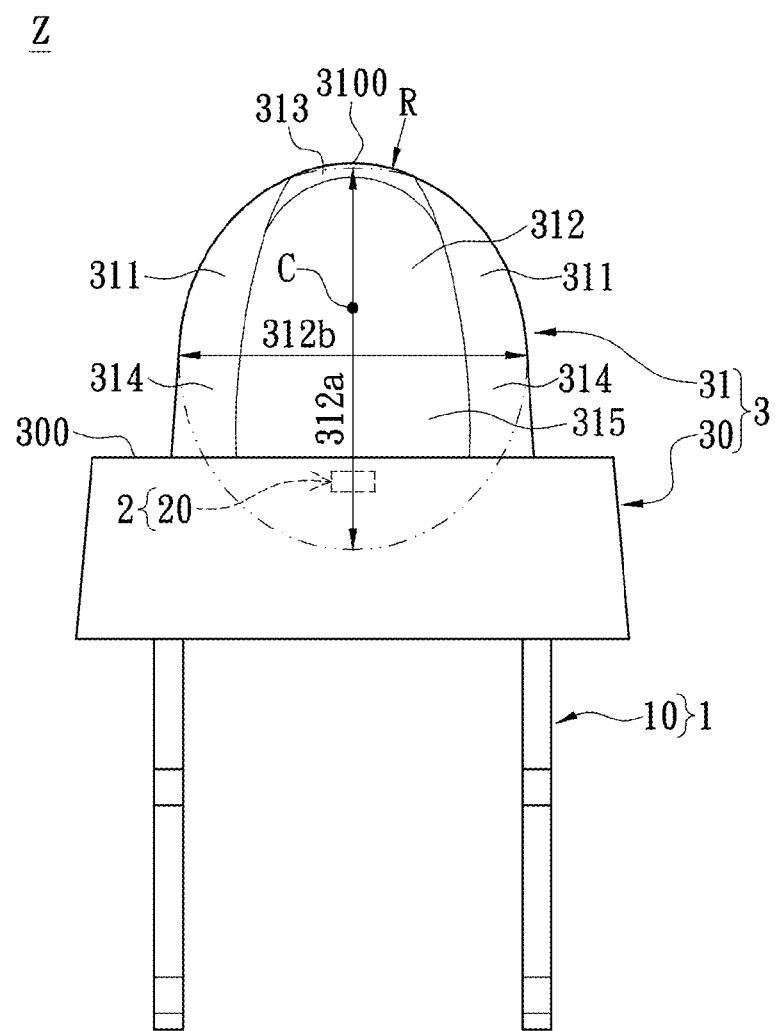
FIG. 13 is a right (or left), schematic view of the LED package structure according to the instant disclosure.
Figure 14:
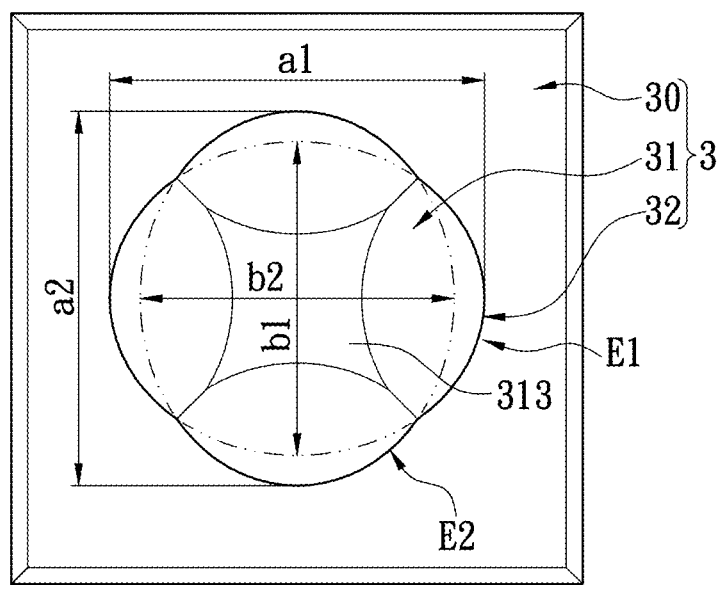
FIG. 14 is a top, schematic view of the LED package structure according to the instant disclosure.

In other words, the lens body 31 is formed by a first ellipsoid defined by the first major axis 311a and the first minor axis 311b (as shown in FIG. 12), a second ellipsoid defined by the second major axis 312a and the second minor axis 312b (as shown in FIG. 13), and a ball defined by the radius R (as shown in FIGS. 12 and 13), where the first ellipsoid and the second ellipsoid are vertically to each other, one part of the first ellipsoid overlaps one part of the second ellipsoid, one part of the ball overlaps the first and the second ellipsoids, and another part of the ball is protruded outside from the topmost side of the two overlapping ellipsoids.

More precisely, the package unit 3 has a connection outline 32 between the lens body 31 and the light-transmitting package body 30 and formed by matching a first ellipse E1 defined by a first major axis a1 and a first minor axis b1 and a second ellipse E2 defined by a second major axis a2 and a second minor axis b2, the first major axis a1 of the first ellipse E1 and the second major axis a2 of the second ellipse E2 are vertical with each other, the lengths of the first major axis a1 of the first ellipse E1 and the second major axis a2 of the second ellipse E2 are the same, the first minor axis b1 of the first ellipse E1 is extended along the second major axis a2 of the second ellipse E2, the second minor axis b2 of the second ellipse E2 is extended along the first major axis a1 of the first ellipse E1, and the lengths of the first minor axis b1 of the first ellipse E1 and the second minor axis b2 of the second ellipse E2 are the same.

The above-mentioned descriptions merely represent the preferred embodiments of the instant disclosure, without any intention or ability to limit the scope of the instant disclosure which is fully described only within the following claims. Various equivalent changes, alterations or modifications based on the claims of instant disclosure are all, consequently, viewed as being embraced by the scope of the instant disclosure.

What is claimed is:

1. A LED package structure, comprising:
   a substrate unit including at least two lead frames separated from each other, wherein each lead frame has an embedded portion and an exposed portion connected with the embedded portion;
   a light-emitting unit including at least one LED chip disposed on one of the at least two lead frames and electrically connected between the at least two lead frames; and
   a package unit including a light-transmitting package body enclosing the light-emitting unit and the embedded portion of each lead frame and a lens body integrated with the light-transmitting package body and disposed above the at least one LED chip, wherein the exposed portion of each lead frame is exposed from the light-transmitting package body;

wherein the lens body has two first light output surfaces symmetrical to each other, two second light output surfaces symmetrical to each other, and a third light output surface disposed on the topmost side thereof to connected to the two first light output surfaces and the two second light output surfaces, and the two first light output surfaces and the two second light output surfaces are alternately connected to each other to form a first surrounding light output surface;

wherein light beams generated by the at least one LED chip pass through the lens body of the package unit to project a cross light pattern on a plane, the cross light pattern has a concentrated cross light shape and a scattered light shape surrounding the concentrated cross light shape, the luminous intensity of the concentrated cross light shape is substantially the same and larger than the luminous intensity of the scattered light shape;

wherein each first light output surface is a first elliptical surface defined by a first major axis and a first minor axis, each second light output surface is a second elliptical surface defined by a second major axis and a second minor axis, and the third light output surface is an arc surface defined by an arc center and a radius, wherein the first major axis and the second major axis are overlapped, the lengths of the first major axis and the second major axis are the same, the first minor axis and the second minor axis are vertical with each other, the lengths of the first minor axis and the second minor axis are the same, and the arc center of the arc surface is disposed on the first major axis and the second major axis.

2. The LED package structure of claim 1, wherein the lens body has a topmost point disposed directly above the at least one LED chip.

3. The LED package structure of claim 1, wherein the package unit has a connection outline between the lens body and the light-transmitting package body and formed by matching a first ellipse defined by a first major axis and a first minor axis and a second ellipse defined by a second major axis and a second minor axis, the first major axis of the first ellipse and the second major axis of the second ellipse are vertical with each other, the lengths of the first major axis of the first ellipse and the second major axis of the second ellipse are the same, the first minor axis of the first ellipse is extended along the second major axis of the second ellipse, the second minor axis of the second ellipse is extended along the first major axis of the first ellipse, and the lengths of the first minor axis of the first ellipse and the second minor axis of the second ellipse are the same.

4. The LED package structure of claim 1, wherein the concentrated cross light shape has a center portion corresponding to the third light output surface, two horizontal extending portions respectively and horizontally extended from the left side and the right side of the center portion and corresponding to the first light output surfaces, and two vertical extending portions respectively and vertically extended from the top side and the bottom side of the center portion and corresponding to the second light output surfaces.

5. The LED package structure of claim 4, wherein the light beams generated by the at least one LED chip pass through the third light output surface of the lens body to project the center portion of the concentrated cross light shape on the plane, the light beams generated by the at least one LED chip pass through the two first light output surfaces of the lens body to respectively project the two horizontal extending portions of the concentrated cross light shape on the plane, and the light beams generated by the at least one LED chip pass through the two second light output surfaces of the lens body to respectively project the two vertical extending portions of the concentrated cross light shape on the plane.

6. A LED package structure, comprising:
a substrate unit;
a light-emitting unit including at least one LED chip disposed on the substrate unit and electrically connected to the substrate unit; and
a package unit including a light-transmitting package body enclosing the light-emitting unit and a lens body integrated with the light-transmitting package body and disposed above the at least one LED chip;
wherein the lens body has two first light output surfaces symmetrical to each other, two second light output surfaces symmetrical to each other, and a third light output surface disposed on the topmost side thereof to connected to the two first light output surfaces and the two second light output surfaces, and the two first light output surfaces and the two second light output surfaces are alternately connected to each other to form a first surrounding light output surface;
wherein the package unit has a connection outline between the lens body and the light-transmitting package body and formed by matching a first ellipse defined by a first major axis and a first minor axis and a second ellipse defined by a second major axis and a second minor axis, the first major axis of the first ellipse and the second major axis of the second ellipse are vertical with each other, the lengths of the first major axis of the first ellipse and the second major axis of the second ellipse are the same, the first minor axis of the first ellipse is extended along the second major axis of the second ellipse, the second minor axis of the second ellipse is extended along the first major axis of the first ellipse, and the lengths of the first minor axis of the first ellipse and the second minor axis of the second ellipse are the same.

7. The LED package structure of claim 6, wherein each first light output surface is a first elliptical surface defined by a first major axis and a first minor axis, each second light output surface is a second elliptical surface defined by a second major axis and a second minor axis, and the third light output surface is an arc surface defined by an arc center and a radius, wherein the first major axis and the second major axis are overlapped, the lengths of the first major axis and the second major axis are the same, the first minor axis and the second minor axis are vertical with each other, the lengths of the first minor axis and the second minor axis are the same, and the arc center of the arc surface is disposed on the first major axis and the second major axis.

8. The LED package structure of claim 6, wherein the lens body has a topmost point disposed directly above the at least one LED chip.

9. A LED package structure, comprising:
a substrate unit;
a light-emitting unit including at least one LED chip disposed on the substrate unit and electrically connected to the substrate unit; and
a package unit including a light-transmitting package body enclosing the light-emitting unit and a lens body integrated with the light-transmitting package body and disposed above the at least one LED chip;
wherein light beams generated by the at least one LED chip pass through the lens body of the package unit to project a cross light pattern on a plane, the cross light pattern has a concentrated cross light shape and a scattered light shape surrounding the concentrated cross light shape, the luminous intensity of the concentrated cross light shape is substantially the same and larger than the luminous intensity of the scattered light shape;

wherein the package unit has a connection outline between the lens body and the light-transmitting package body and formed by matching a first ellipse defined by a first major axis and a first minor axis and a second ellipse defined by a second major axis and a second minor axis, the first major axis of the first ellipse and the second major axis of the second ellipse are vertical with each other, the lengths of the first major axis of the first ellipse and the second major axis of the second ellipse are the same, the first minor axis of the first ellipse is extended along the second major axis of the second ellipse, the second minor axis of the second ellipse is extended along the first major axis of the first ellipse, and the lengths of the first minor axis of the first ellipse and the second minor axis of the second ellipse are the same.

10. The LED package structure of claim 9, wherein the concentrated cross light shape has a center portion, two horizontal extending portions respectively and horizontally extended from the left side and the right side of the center portion, and two vertical extending portions respectively and vertically extended from the top side and the bottom side of the center portion.

11. The LED package structure of claim 10, wherein the light beams generated by the at least one LED chip pass through the lens body to project the center portion of the concentrated cross light shape on the plane, the light beams generated by the at least one LED chip pass through the lens body to respectively project the two horizontal extending portions of the concentrated cross light shape on the plane, and the light beams generated by the at least one LED chip pass through the lens body to respectively project the two vertical extending portions of the concentrated cross light shape on the plane.

12. The LED package structure of claim 9, wherein the lens body has a topmost point disposed directly above the at least one LED chip.

* * * * *